(12) United States Patent
Jiang

(10) Patent No.: US 11,609,664 B2
(45) Date of Patent: Mar. 21, 2023

(54) CAPACITANCE DETECTION CIRCUIT, SENSOR, CHIP AND ELECTRONIC DEVICE

(71) Applicant: Shenzhen Goodix Technology Co., Ltd., Guangdong (CN)

(72) Inventor: Hong Jiang, Guangdong (CN)

(73) Assignee: Shenzhen Goodix Technology Co., Ltd., Guangdong (CN)

(*) Notice: Subject to any disclaimer, the term of this patent is extended or adjusted under 35 U.S.C. 154(b) by 0 days.

(21) Appl. No.: 17/488,280

(22) Filed: Sep. 28, 2021

(65) Prior Publication Data
US 2022/0035470 A1 Feb. 3, 2022

Related U.S. Application Data

(63) Continuation of application No. PCT/CN2020/077661, filed on Mar. 3, 2020.

(51) Int. Cl.
*G06F 3/044* (2006.01)

(52) U.S. Cl.
CPC .................... *G06F 3/044* (2013.01)

(58) Field of Classification Search
CPC .............. G06F 3/044; H03K 17/962; H03K 2217/960725
See application file for complete search history.

(56) References Cited

U.S. PATENT DOCUMENTS

| 8,878,555 B2 | 11/2014 | Huang et al. |
| 2010/0141275 A1 | 6/2010 | Matsushima |
| 2011/0186359 A1* | 8/2011 | Chen ............... G06F 3/04182 178/18.06 |
| 2011/0273400 A1* | 11/2011 | Kwon ............... G06F 3/04166 327/337 |

(Continued)

FOREIGN PATENT DOCUMENTS

| CN | 101315398 A | 12/2008 |
| CN | 102253289 A | 11/2011 |

(Continued)

OTHER PUBLICATIONS

Shenzhen Goodix Technology Co., Ltd., International Search Report, PCT/CN2020/077661, dated Dec. 7, 2020, 7 pgs.

(Continued)

*Primary Examiner* — Hong Zhou
(74) *Attorney, Agent, or Firm* — USCH Law, PC

(57) ABSTRACT

A capacitance detection circuit is provided, which includes a capacitance control module, a charge conversion module and a filter module connected with each other. The capacitance control module controls a capacitor to be charged/discharged for multiple times and generates a digital voltage signal according to an amount of received charges. The capacitor releases all stored charges after being charged to a preset voltage during each charge/discharge. In response to the digital voltage signal being at a high level, the charge conversion module outputs negative charges with a preset charge amount to the capacitance control module. The preset charge amount is greater than or equal to an amount of the stored charges when the capacitor is charged to the preset voltage. The filter module obtains a value representing a capacitance of the capacitor according to the digital voltage signal.

19 Claims, 5 Drawing Sheets

(56) References Cited

U.S. PATENT DOCUMENTS

| | | | | |
|---|---|---|---|---|
| 2014/0035601 A1* | 2/2014 | Fujiyoshi | ............ | G06F 3/04182 324/684 |
| 2014/0176482 A1* | 6/2014 | Wei | .................... | G06F 3/04182 345/174 |
| 2015/0317033 A1 | 11/2015 | Chen et al. | | |
| 2016/0364079 A1* | 12/2016 | Qiu | ....................... | G06F 3/0418 |
| 2017/0315642 A1* | 11/2017 | Yang | ......................... | G01D 5/24 |
| 2018/0156853 A1* | 6/2018 | Kuang | ................. | G06F 3/04166 |
| 2019/0272056 A1 | 9/2019 | Wang et al. | | |

FOREIGN PATENT DOCUMENTS

| | | | |
|---|---|---|---|
| CN | 102576043 | A | 7/2012 |
| CN | 203084695 | U | 7/2013 |
| CN | 203117298 | U | 8/2013 |
| CN | 105116232 | A | 12/2015 |
| CN | 105183248 | A | 12/2015 |
| CN | 107466368 | A | 12/2017 |
| CN | 109496273 | A | 3/2019 |
| CN | 211375581 | U | 8/2020 |
| WO | 2019241966 | A1 | 12/2019 |
| WO | 2020237503 | A1 | 12/2020 |
| WO | 2021097727 | A1 | 5/2021 |

OTHER PUBLICATIONS

Shenzhen Goodix Technology Co.,Ltd., CN First Office Action with English translation, CN 202080001590.3, dated Oct. 10, 2022, 19 pgs.

* cited by examiner

CAPACITANCE DETECTION CIRCUIT, SENSOR, CHIP AND ELECTRONIC DEVICE

CROSS-REFERENCE TO RELATED APPLICATION

This application is a continuation of PCT Patent Application No. PCT/CN2020/077661, filed on Mar. 3, 2020, the disclosure of which is hereby incorporated by reference in its entirety.

TECHNICAL FIELD

The present disclosure relates to the field of circuit technology, in particular to a capacitance detection circuit, a sensor, a chip and an electronic device.

BACKGROUND

As a common sensing device, a capacitance sensor may reflect the parameters to be measured through its stored charge value after it is fully charged, so as to realize various parameter detection, such as pressure detection, liquid level detection, distance sensing, impurity detection, touch detection and the like.

SUMMARY

Some embodiments of the present disclosure are intended to provide a capacitance detection circuit, a sensor, a chip and an electronic device, which may digitize a capacitance of a capacitor to be detected without an analog circuit such as an analog-to-digital converter, thereby realizing a simple circuit structure and reducing the power consumption and cost.

Some embodiments of the present disclosure provide a capacitance detection circuit, including: a capacitance control module, a charge conversion module and a filter module which are connected with each other; where the capacitance control module is configured to control a capacitor to be detected to be charged and discharged for multiple times, and generate a digital voltage signal according to an amount of received charges; where the capacitor to be detected releases all stored charges after being charged to a preset voltage during each charge and discharge; in response to the digital voltage signal being at a high level, the charge conversion module is configured to output negative charges with a preset charge amount to the capacitance control module, where the preset charge amount is greater than or equal to an amount of the stored charges when the capacitor to be detected is charged to the preset voltage; and the filter module is configured to obtain a value representing a capacitance of the capacitor to be detected according to the digital voltage signal generated after the capacitor to be detected is charged and discharged for the multiple times.

Some embodiments of the present disclosure further provide a sensor which includes the capacitance detection circuit described above.

Some embodiments of the present disclosure further provide a chip which includes the capacitance detection circuit described above.

Some embodiments of the present disclosure further provide an electronic device which includes the capacitance detection circuit described above.

In the embodiments of the present disclosure, the capacitance control module controls the capacitor to be detected to be charged and discharged for multiple times. The capacitor to be detected releases all stored charges after being charged to the preset voltage during each charge and discharge. The capacitance control module may output a corresponding digital voltage signal according to the amount of received charges. In response to the digital voltage signal being at a low level, the capacitance control module only accepts the charges released by the capacitor to be detected. In response to the digital voltage signal being at a high level, the charge conversion module outputs the negative charges with the preset charge amount to the capacitance control module, that is, the capacitance control module receives the charges output by both the capacitor to be detected and the charge conversion module, and then after the capacitor to be detected is charged and discharged for multiple times, the filter module may obtain the value representing the capacitance of the capacitor to be detected according to the digital voltage signal generated after the capacitor to be detected is charged and discharged for multiple times. The capacitance of the capacitor to be detected may be digitized without the analog circuit such as the analog-to-digital converter, thereby realizing a simple circuit structure and reducing the power consumption and cost. Furthermore, the anti-interference ability of the capacitance detection circuit may be improved by increasing the charge and discharge times of the capacitor to be detected.

In some embodiments, the capacitance control module includes a charge transfer module, a voltage conversion module and a comparison module which are connected in sequence; where the comparison module is connected to the filter module, and the charge conversion module is connected to the voltage conversion module; where the charge transfer module is configured to control the capacitor to be detected to be charged and discharged for the multiple times, where the capacitor to be detected releases all the stored charges to the voltage conversion module after being charged to the preset voltage during each charge and discharge; the voltage conversion module is configured to convert all the stored charges that are received into an analog voltage signal; the comparison module is configured to output the digital voltage signal according to a preset voltage threshold and the analog voltage signal; and in response to the digital voltage signal being at the high level, the charge conversion module is configured to output the negative charges with the preset charge amount to the voltage conversion module. This embodiment provides a specific structure of the capacitance control module.

In some embodiments, the charge transfer module includes a first switch, a second switch and a first power supply; where the first power supply is connected to a first terminal of the first switch, a second terminal of the first switch is connected to a first terminal of the second switch, a second terminal of the second switch is grounded, a connection between the first switch and the second switch is connected to a first terminal of the capacitor to be detected, a second terminal of the capacitor to be detected is connected to the voltage conversion module, and a control terminal of the first switch and a control terminal of the second switch are respectively configured to receive a driving signal; in response to the driving signal, the first switch is configured to be closed when the capacitor to be detected is charged and be opened when the capacitor to be detected is discharged; and in response to the driving signal, the second switch is configured to be opened when the capacitor to be detected is charged and be closed when the capacitor to be detected is discharged. This embodiment provides a specific structure of a charge transfer module applied to a self-capacitive detection.

In some embodiments, the charge transfer module includes a third switch, a fourth switch and a second power supply; where the second power supply is connected to a first terminal of the third switch, a second terminal of the third switch is connected to a first terminal of the fourth switch, a second terminal of the fourth switch is connected to the voltage conversion module, a connection between the third switch and the fourth switch is connected to a first terminal of the capacitor to be detected, a second terminal of the capacitor to be detected is grounded, and a control terminal of the third switch and a control terminal of the fourth switch are respectively configured to receive a driving signal; in response to the driving signal, the third switch is configured to be opened when the capacitor to be detected is discharged and be closed when the capacitor to be detected is charged; and in response to the driving signal, the fourth switch is configured to be closed when the capacitor to be detected is discharged and be opened when the capacitor to be detected is charged. This embodiment provides a specific structure of a charge transfer module applied to a mutual capacitive detection.

In some embodiments, the voltage conversion module includes an operational amplifier, a first reference capacitor and a fifth switch; where the charge transfer module and the charge conversion module are respectively connected to an inverting input of the operational amplifier, a non-inverting input of the operational amplifier is grounded, two terminals of the first reference capacitor are respectively connected to the inverting input of the operational amplifier and an output of the operational amplifier, two terminals of the fifth switch are respectively connected to the two terminals of the fifth reference capacitor, and a control terminal of the fifth switch is configured to receive a reset signal; and in response to the reset signal, the fifth switch is configured to keep closed within a preset duration before the charge transfer module controls the capacitor to be detected to be charged and discharged for the multiple times. This embodiment provides a specific structure of the voltage conversion module.

In some embodiments, the comparison module includes a voltage comparator and a first trigger; where a non-inverting input of the voltage comparator is connected to the voltage conversion module, an inverting input of the voltage comparator is grounded, an output of the voltage comparator is connected to a first input of the first trigger, a second input of the first trigger is configured to receive an output control signal, a third input of the first trigger is configured to receive a driving signal, and an output of the first trigger is connected to the filter module; in response to a voltage value of the analog voltage signal being larger than the voltage threshold, the voltage comparator is configured to output a high level, and in response to the voltage value of the analog voltage signal being smaller than the voltage threshold, the voltage comparator is configured to output a low level; and in response to the driving signal being at a rising edge, the first trigger is configured to output a current level of the voltage comparator as a level of the digital voltage signal, and in response to the driving signal being at a falling edge, the first trigger is configured to keep the level of the digital voltage signal unchanged. This embodiment provides a specific structure of the comparison module.

In some embodiments, the filter module includes a counter and a second trigger, the comparison module is connected to an input of the counter, an output of the counter is connected to a first input of the second trigger, and a second input of the second trigger is configured to receive an output control signal; where a driving terminal of the counter is configured to receive a driving signal, and in response to the driving signal being at a rising edge and the digital voltage signal being at a high level, the counter is configured to add 1 to a current count value; and in response to the output control signal being at the rising edge, the second trigger is configured to output a count value of the counter as the value representing the capacitance of the capacitor to be detected. This embodiment provides a specific structure of the filter module.

In some embodiments, the charge transfer module includes a logic controller and a charge output submodule, a first terminal of the logic controller is connected to the comparison module, and a second terminal of the logic controller is connected to the voltage conversion module through the charge output submodule; where in response to the digital voltage signal being at the high level, the logic controller is configured to control the charge output submodule to output the negative charges with the preset charge amount to the voltage conversion module. This embodiment provides a specific structure of the charge conversion module.

In some embodiments, the charge output submodule includes a sixth switch, a seventh switch, an eighth switch, a ninth switch, a third power supply and a second reference capacitor; where a first terminal of the sixth switch is connected to the voltage conversion module, a second terminal of the sixth switch is connected to a first terminal of the eighth switch, a second terminal of the eighth switch is grounded, a connection between the sixth switch and the eighth switch is connected to a first terminal of the second reference capacitor, a first terminal of the seventh switch is connected to the third power supply, a second terminal of the seventh switch is connected to a first terminal of the ninth switch, a second terminal of the ninth switch is grounded, and a connection between the seventh switch and the ninth switch is connected to a second terminal of the second reference capacitor; a control terminal of the sixth switch, a control terminal of the seventh switch, a control terminal of the eighth switch and a control terminal of the ninth switch are respectively connected to the logic controller; in response to the digital voltage signal being at a low level, the logic controller is configured to control the sixth switch and the ninth switch to be closed and control the seventh switch and the eighth switch to be opened; and in response to the digital voltage signal being at the high level, the logic controller is configured to control the sixth switch and the ninth switch to be opened and control the seventh switch and the eighth switch to be closed. This embodiment provides a specific structure of the charge output submodule.

In some embodiments, the capacitance detection circuit further includes an extraction module; the capacitance control module is connected to the filter module through the extraction module; where the extraction module is configured to output the digital voltage signal within a preset time period to the filter module. In this embodiment, the extraction module is added to the capacitance detection circuit, so that the capacitor to be detected may be detected periodically, thus reducing the power consumption.

In some embodiments, the extraction module is an AND circuit; a first input of the AND circuit is connected to the capacitance control module, and an output of the AND circuit is connected to the filter module; where a second input terminal of the AND circuit is configured to receive an output control signal, and the preset time period is a duration of the output control signal at a high level in one cycle. This embodiment provides a specific implementation of the extraction module.

BRIEF DESCRIPTION OF THE DRAWINGS

One or more embodiments are described as examples with reference to the corresponding figures in the accompanying drawings, and the examples do not constitute a limitation to the embodiments. Elements with the same reference numerals in the accompanying drawings represent similar elements. The figures in the accompanying drawings do not constitute a proportion limitation unless otherwise stated.

DETAILED DESCRIPTION

In order to make objectives, technical solutions and advantages of the present disclosure clearer, embodiments of the present disclosure will be described below in detail with reference to accompanying drawings and embodiments. It should be understood that specific embodiments described here are used only to explain the disclosure but not to constitute a limitation to the present disclosure.

When a capacitance sensor is used for parameter detection, the measurement of a capacitance of the capacitance sensor is one of the core steps. At present, the measurement of the capacitance value is generally realized by an analog circuit including an analog-to-digital converter (ADC), which has high power consumption and cost. Based on this, the inventor proposes the technical solution of the present disclosure.

A first embodiment of the present disclosure relates to a capacitance detection circuit, which is applied to a sensor, a chip or an electronic device, such as a capacitance sensor, a capacitance detection chip, a mobile phone, a tablet PC and the like. The capacitance detection circuit may measure the capacitance of the capacitor, and then use the measured capacitance to realize the parameter detection, such as pressure detection, liquid level detection, distance sensing, impurity detection, touch detection and the like.

Figure 1:
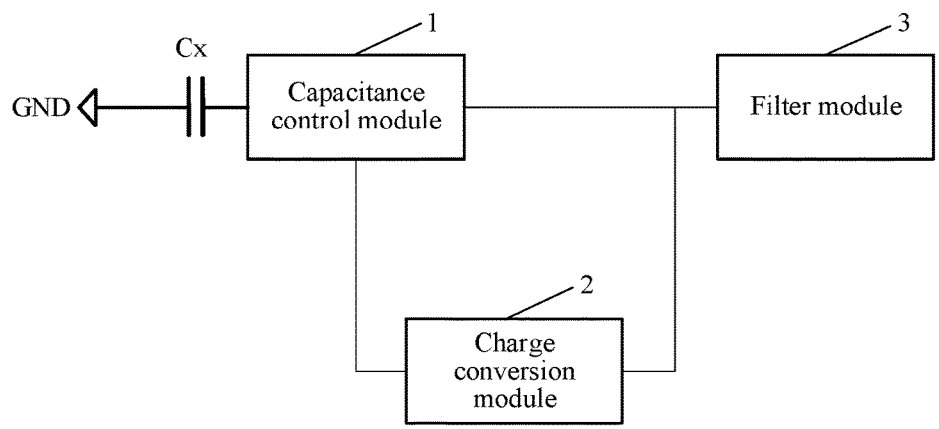
FIG. 1 is a schematic diagram of a capacitance detection circuit according to a first embodiment of the present disclosure.

Referring to FIG. 1, the capacitance detection circuit includes a capacitance control module 1, a charge conversion module 2 and a filter module 3 which are connected with each other. A capacitor $C_x$ to be detected is connected to the capacitance control module 1 in series or in parallel. In the figures, the capacitor $C_x$ to be detected being connected to the capacitance control module 1 in series is taken as an example, one terminal of the capacitor $C_x$ to be detected is connected to the capacitance control module 1, and the other terminal of the capacitor $C_x$ to be detected is grounded (GND).

The capacitance control module 1 is configured to control the capacitor $C_x$ to be detected to be charged and discharged for multiple times and generate a digital voltage signal according to an amount of received charges. The capacitor $C_x$ to be detected releases all stored charges after being charged to a preset voltage during each charge and discharge.

In response to the digital voltage signal being at a high level, the charge conversion module 2 is configured to output negative charges with a preset charge amount to the capacitance control module 1. The preset charge amount is greater than or equal to an amount of the stored charges when the capacitor $C_x$ to be detected is charged to the preset voltage.

The filter module 3 is configured to obtain a value representing the capacitance of the capacitor $C_x$ to be detected according to the digital voltage signal generated after the capacitor $C_x$ to be detected is charged and discharged for multiple times.

In the embodiments of the present disclosure, the capacitance control module controls the capacitor to be detected to be charged and discharged for multiple times. The capacitor to be detected releases all stored charges after being charged to the preset voltage during each charge and discharge. The capacitance control module may output a corresponding digital voltage signal according to the amount of received charges. In response to the digital voltage signal being at a low level, the capacitance control module only accepts the charges released by the capacitor to be detected. In response to the digital voltage signal being at a high level, the charge conversion module outputs the negative charges with the preset charge amount to the capacitance control module, that is, the capacitance control module receives the charges output by both the capacitor to be detected and the charge conversion module, and then after the capacitor to be detected is charged and discharged for multiple times, the filter module may obtain the value representing the capacitance of the capacitor to be detected according to the digital voltage signal generated after the capacitor to be detected is charged and discharged for multiple times. The capacitance of the capacitor to be detected may be digitized without the analog circuit such as the analog-to-digital converter, thereby realizing a simple circuit structure and reducing the power consumption and cost. Furthermore, the anti-interference ability of the capacitance detection circuit may be improved by increasing the charge and discharge times of the capacitor to be detected.

The implementation details of the capacitance detection circuit in this embodiment are described in detail below. The following contents are only the implementation details provided for convenience of understanding, and are not necessary for implementing the technical solution of the present disclosure.

Figure 2:
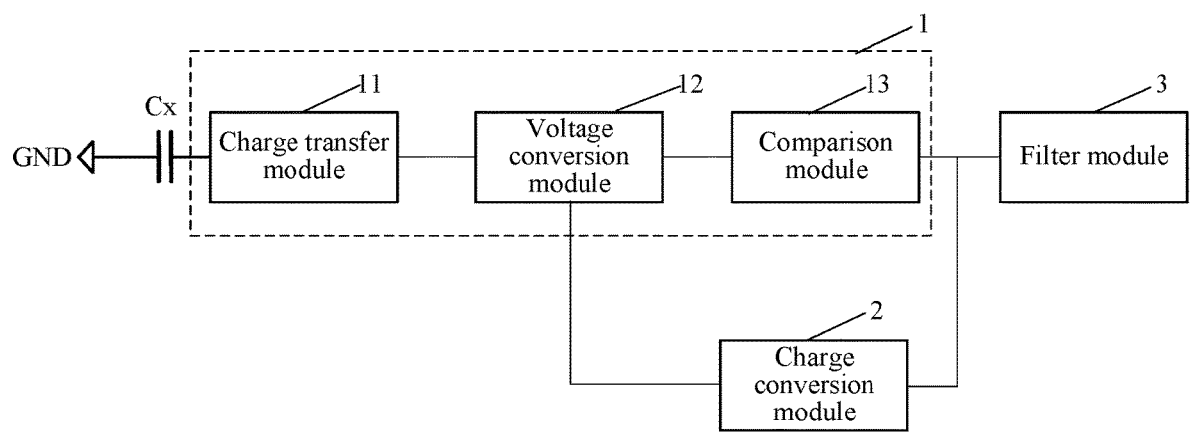
FIG. 2 is another schematic diagram of the capacitance detection circuit according to the first embodiment of the present disclosure, where a capacitance control module includes a charge transfer module, a voltage conversion module and a comparison module.

Referring to FIG. 2, the capacitance control module 1 includes a charge transfer module 11, a voltage conversion module 12 and a comparison module 13 which are connected in sequence. The capacitor $C_x$ to be detected is connected to the charge transfer module 11 (which is taken as an example in FIG. 2), or the capacitor $C_x$ to be detected is connected to both the charge transfer module 11 and the voltage conversion module 12.

The charge transfer module 11 is configured to control the capacitor $C_x$ to be detected to be charged and discharged for multiple times. During each charge and discharge of the capacitor $C_x$ to be detected, the capacitor $C_x$ to be detected releases all the stored charges to the voltage conversion module 12 after being charged to a preset voltage $V_{tx}$, that is, a process of each charge and discharge is equivalent to a process of each charge transfer of the capacitor $C_x$ to be detected. The capacitor $C_x$ to be detected is charged to the preset voltage $V_{tx}$ first, the amount $Qc_x$ of charges stored in the capacitor $C_x$ to be detected at this time satisfies $Qc_x=V_{tx}*C_x$, and then the capacitor $C_x$ to be detected is controlled to be discharged and release all the stored charges to the voltage conversion module 12.

The voltage conversion module 12 is configured to convert the received charges into an analog voltage signal. Specifically, the voltage conversion module 12 may receive the charges of the capacitor $C_x$ to be detected during each charge and discharge of the capacitor $C_x$ to be detected, and convert the inflowing charges into a voltage to output. The amount of the charges received by the voltage conversion module 12 may change after each charge and discharge of the capacitor $C_x$ to be detected, which also makes the voltage output by the voltage conversion module 12 change. Multiple voltages output by the voltage conversion module 12 may form a continuous analog voltage signal after the capacitor $C_x$ to be detected is controlled to be charged and discharged for multiple times.

The comparison module 13 is configured to output the digital voltage signal according to a preset voltage threshold and the analog voltage signal. Specifically, the comparison module 13 compares a current voltage value with the preset voltage threshold after receiving the analog voltage signal sent by the voltage conversion module 12. When the voltage value is greater than the voltage threshold, the output digital signal is at a high level 1. When the voltage value is less than the voltage threshold, the output digital signal is at a low level 0. Therefore, the comparison module 13 outputs a high or low level signal according to the voltage values at different times (different charge and discharge times) after receiving the analog voltage signal, thus forming the digital voltage signal. In an example, the voltage threshold of the comparison module 13 may be half of the preset voltage $V_{tx}$.

In response to the digital voltage signal being at the high level, the charge conversion module 2 is configured to output the negative charges with the preset charge amount to the voltage conversion module 12. The preset charge amount is greater than or equal to the amount of the stored charge when the capacitor $C_x$ to be detected is charged to the preset voltage. It should be noted that in this embodiment, the charge conversion module 2 outputting the negative charges is taken as an example, but the invention is not limited to such exemplification. The charge conversion module 2 may also be set to output positive charges, as long as an inverse adder is provided in the voltage conversion module 12.

The filter module 3 is configured to obtain the value representing the capacitance of the capacitor $C_x$ to be detected according to the digital voltage signal generated after the capacitor $C_x$ to be detected is charged and discharged for multiple times. Specifically, as described above, each charge and discharge of the capacitor $C_x$ to be detected corresponds to one value of the digital voltage signal, which may be 0 or 1. Then the number of values 1 in the digital voltage signal corresponding to multiple charges and discharges may be counted, and the number is the value representing the capacitance of the capacitor $C_x$ to be detected. The value may be input into a processor of an electronic device after being obtained, so that the processor may obtain the capacitance of the capacitor $C_x$ to be detected according to a preset measurement range of the capacitance detection circuit. For example, the measurement range of the capacitance detection circuit is 0 to 10 pF, and the charge and discharge times of the capacitor $C_x$ to be detected are 1000 times. If the number of values 1 in the digital voltage signal corresponding to 1000 charge and discharge times is 500 times, the capacitance of the capacitor $C_x$ to be detected is 500÷1000×10 pF=5 pF.

In this embodiment, the charge transfer is performed on the capacitor $C_x$ to be detected first for multiple times during digitizing the capacitance of the capacitor $C_x$ to be detected. The voltage conversion module 12 may receive the charges of each discharge of the capacitor $C_x$ to be detected which are transferred by the charge transfer module 11 during each charge transfer of the capacitor $C_x$ to be detected. When the amount of charges accumulated in the voltage conversion module 12 does not reach a critical value $Q_{max}$, a voltage value of the analog voltage signal output by the voltage conversion module 12 is less than the voltage threshold, and the digital voltage signal output by the comparison module 13 is at a low level. At this time, the charges received by the voltage conversion module 12 only comes from the capacitor $C_x$ to be detected. With the accumulation of the charges in the voltage conversion module 12, when the amount of charges accumulated in the voltage conversion module 12 reaches the critical value $Q_{max}$, the voltage value of the analog voltage signal output by the voltage conversion module 12 is greater than the voltage threshold, and the digital voltage signal output by the comparison module 13 is at a high level. At this time, the charge conversion module 2 sends the negative charges with the preset charge amount to the voltage conversion module 12. That is, the voltage conversion module 12 receives both the charges discharged by the capacitor $C_x$ to be detected and the negative charges sent by the charge conversion module 2. While the preset charge amount is greater than or equal to the amount of the stored charges when the capacitor $C_x$ to be detected is charged to the preset voltage, the charges accumulated in the voltage conversion module 12 is consumed, which results in the amount of the charges accumulated in the voltage conversion module 12 less than the critical value $Q_{max}$. Then, the voltage value of the analog voltage signal output by the voltage conversion module 12 is less than the voltage threshold, the digital voltage signal output by the comparison module 13 is at a low level, and the voltage conversion module 12 continues to accumulate charges until the amount of the accumulated charges reaches the critical value $Q_{max}$ again. And then, the above process is repeated until the charge transfer of the capacitor $C_x$ to be detected is completed. At this time, the number of the high levels of the digital voltage signal in multiple charge transfers is counted, which is then the value representing the capacitance of the capacitor $C_x$ to be detected.

In this embodiment, after the driving signal is received, in response to the driving signal, the charge transfer module controls the capacitor to be detected to be charged and discharged for multiple times. During each charge and discharge of the capacitor to be detected, the capacitor to be detected releases the stored charge to the voltage conversion module after being charged to the preset voltage. Thus, the capacitor to be detected may output a given amount of charges to the voltage conversion module for multiple times after being charged and discharged for multiple times. Then the voltage conversion module may output a corresponding voltage according to the amount of received charges to convert the received charges into the analog voltage signal and send the analog voltage signal to the comparison module. The comparison module converts the analog voltage signal into the digital voltage signal according to the preset voltage threshold and the received analog voltage signal, and inputs the digital voltage signal into the charge conversion module. In response to the digital voltage signal being at the high level, the charge conversion module may output the negative charges with the preset charge amount to feed back to the voltage conversion module. Then, after the capacitor to be detected is charged and discharged for multiple times, the filter module may obtain the value representing the capacitance of the capacitor to be detected according to the digital voltage signal generated after the capacitor to be detected is charged and discharged for multiple times. The capacitance of the capacitor to be detected may be digitized without the analog circuit such as the analog-to-digital converter, thereby realizing a simple circuit structure and reducing the power consumption and cost. Furthermore, the anti-interference ability of the capacitance detection circuit may be improved by increasing the charge and discharge times of the capacitor to be detected.

A second embodiment of the present disclosure relates to a capacitance detection circuit. Compared with the first embodiment, the main difference of this embodiment is that specific structures of some modules in the capacitance detection circuit are provided.

In this embodiment, a circuit structure of a charge transfer module 11 may be configured according to the detection mode as required, specifically as follows.

Figure 3:
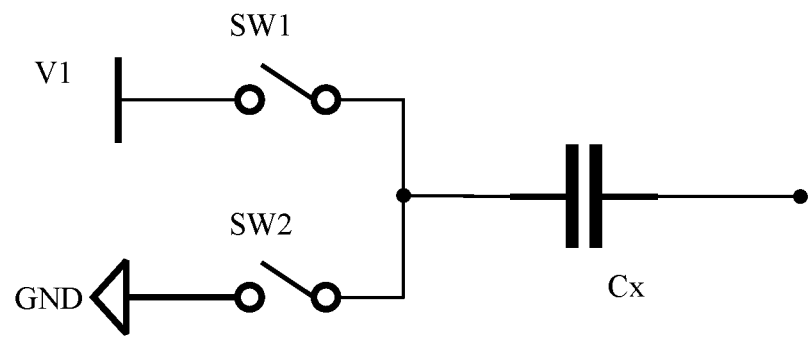
FIG. 3 is a structural diagram of a charge transfer module according to a second embodiment of the present disclosure, where the charge transfer module is applied to a mutual-capacitance detection mode.

The charge transfer module 11 is applied to a mutual-capacitance detection mode. Referring to FIG. 3, the charge transfer module 11 includes a first switch SW1, a second switch SW2 and a first power supply V1.

The first power supply V1 is connected to a first terminal of the first switch SW1, a second terminal of the first switch SW1 is connected to a first terminal of the second switch SW2, a second terminal of the second switch SW2 is grounded (GND), a connection between the first switch SW1 and the second switch SW2 is connected to a first terminal of a capacitor $C_x$ to be detected, a second terminal of the capacitor $C_x$ to be detected is connected to a voltage conversion module 12, and a control terminal of the first switch SW1 and a control terminal of the second switch SW2 are respectively configured to receive a driving signal (not shown in the figure). Herein, the driving signal is a signal sent by a signal generator, which may be a RC oscillator, a processor, a crystal oscillator circuit, and the like.

In response to the driving signal, the first switch SW1 is configured to be closed when the capacitor $C_x$ to be detected is discharged and be opened when the capacitor $C_x$ to be detected is charged.

In response to the driving signal, the second switch SW2 is configured to be opened when the capacitor $C_x$ to be detected is discharged and be closed when the capacitor $C_x$ to be detected is discharged.

Herein, the driving signal may be a clock signal. Referring to a timing diagram of FIG. 4, after the driving signal is received, the first switch SW1 is closed in response to the driving signal being at a high level and is opened in response to the driving signal being at a low level. After the driving signal is received, the second switch SW2 is opened in response to the driving signal being at the high level and is closed in response to the driving signal being at the low level. Thus, in each cycle of the driving signal, the first switch SW1 is opened and the second switch SW2 is closed in response to the driving signal being at the high level. At this time, the capacitor $C_x$ to be detected is connected to GND, and the charges in the capacitor $C_x$ to be detected are completely released, thus the amount of charges is 0. In response to the driving signal being at the low level, the first switch SW1 is closed and the second switch SW2 is opened. At this time, the capacitor $C_x$ to be detected is connected to the first power supply V1 and is charged to a preset voltage $V_{tx}$, thus the amount $Qc_x$ of charges stored in the capacitor $C_x$ to be detected satisfies $Qc_x=V_{tx}*C_x$. Then, in response to the driving signal in a next cycle being at the high level, the first switch SW1 is closed and the second switch SW2 is opened, and all the charges stored in the capacitor $C_x$ to be detected are released to the voltage conversion module 12.

Figure 5:
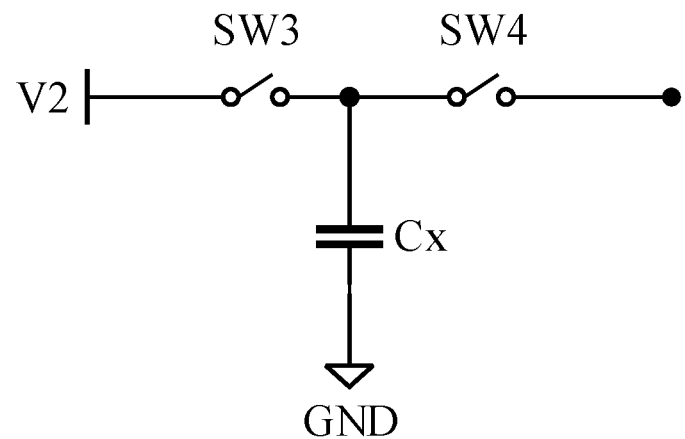
FIG. 5 is another structural diagram of the charge transfer module according to the second embodiment of the present disclosure, where the charge transfer module is applied to a self-capacitance detection mode.

The charge transfer module 11 is applied to a self-capacitance detection mode. Referring to FIG. 5, the charge transfer module 11 includes a third switch SW3, a fourth switch SW4 and a second power supply V2.

The second power supply V2 is connected to a first terminal of the third switch SW3, a second terminal of the third switch SW3 is connected to a first terminal of the fourth switch SW4, a second terminal of the fourth switch SW4 is connected to the voltage conversion module 12, a connection between the third switch SW3 and the fourth switch SW4 is connected to a first terminal of the capacitor $C_x$ to be detected, a second terminal of the capacitor $C_x$ to be detected is grounded, and a control terminal of the third switch SW3 and a control terminal of the fourth switch SW4 are respectively configured to receive a driving signal.

In response to the driving signal, the third switch SW3 is configured to be opened when the capacitor to be detected is discharged and be closed when the capacitor $C_x$ to be detected is charged.

In response to the driving signal, the fourth switch SW4 is configured to be closed when the capacitor to be detected is discharged and be opened when the capacitor $C_x$ to be detected is charged.

Figure 4:
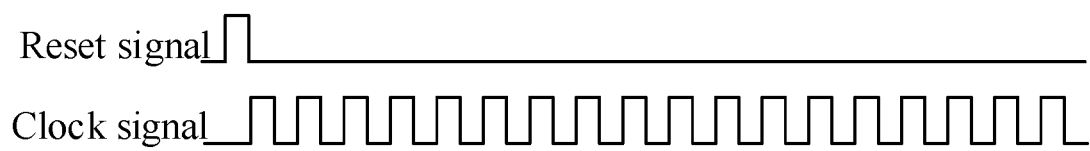
FIG. 4 is a timing diagram in which a driving signal is a clock signal according to the second embodiment of the present disclosure.

In this embodiment, referring to FIG. 4, the driving signal may also be a clock signal. After the driving signal is received, the third switch SW3 is closed in response to the driving signal being at a high level and is opened in response to the driving signal being at a low level. After the driving signal is received, the fourth switch SW4 is opened in response to the driving signal being at the high level and is closed in response to the driving signal being at the low level. Thus, in each cycle of the driving signal, the third switch SW3 is closed and the fourth switch SW4 is opened in response to the driving signal being at the high level. At this time, the capacitor $C_x$ to be detected is connected to the second power supply V2 and is charged to the preset voltage $V_{tx}$, thus the amount $Qc_x$ of charges stored in the capacitor $C_x$ to be detected satisfies $Qc_x=V_{tx}*C_x$. In response to the driving signal being at the low level, the third switch SW3 is opened and the fourth switch SW4 is closed, and the capacitor $C_x$ to be detected is connected to GND. All the charges in the capacitor $C_x$ to be detected are released, thus the amount of charges is 0.

Figure 6:
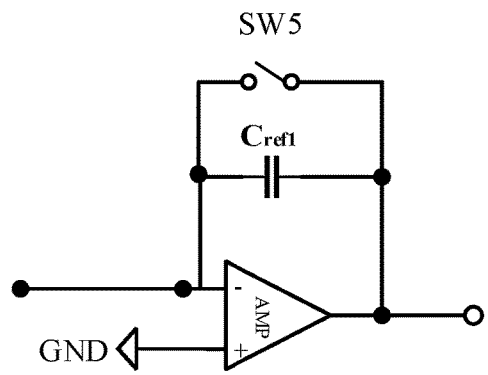
FIG. 6 is a structural diagram of a voltage conversion module according to the second embodiment of the present disclosure.

Referring to FIG. 6, the voltage conversion module 12 includes an operational amplifier AMP, a first reference capacitor $C_{ref1}$ and a fifth switch SW5.

The charge transfer module 11 and the charge conversion module 2 are respectively connected to an inverting input of the operational amplifier AMP. A non-inverting input of the operational amplifier AMP is grounded (GND). Two terminals of the first reference capacitor $C_{ref1}$ are respectively connected to the inverting input of the operational amplifier AMP and an output of the operational amplifier AMP. Two terminals of the fifth switch SW5 are respectively connected to the two terminals of the first reference capacitor $C_{ref1}$, and a control terminal of the fifth switch SW5 is configured to receive a reset signal.

The fifth switch SW5 is configured to keep being closed within a preset duration when receiving the reset signal. Specifically, referring to a waveform diagram of the reset signal in FIG. 4, the reset signal is input into the fifth switch SW5 before the capacitance detection circuit detects the capacitor $C_x$ to be detected. In response to the reset signal being at a high level, the fifth switch SW5 is closed. A duration of the reset signal being at the high level is regarded as the preset duration, and the fifth switch SW5 may be kept being closed within the preset duration, so that all the charges at the two terminals of the first reference capacitor $C_{ref1}$ may be released. In response to the reset signal being at a low level, the fifth switch SW5 may be opened, so that the fifth switch SW5 is opened after the preset duration, and then the capacitance detection circuit may detect the capacitor $C_x$ to be detected.

When detecting the capacitor $C_x$ to be detected, the charge transfer of the capacitor $C_x$ to be detected is performed for multiple times. The amount of charges received by the operational amplifier AMP is represented by $Q_{accumulate}$ below. An output voltage $V_{out}$ of the operational amplifier AMP satisfies $V_{out}=Q_{accumulate}/C_{ref1}$. When the output voltage $V_{out}$ of the operational amplifier AMP is less than a preset voltage threshold $V_x$, an output of the comparison module 13 is 0. At this time, only the charges released by the capacitor $C_x$ to be detected go to the operational amplifier AMP. With the increasing amount of charges received by the operational amplifier AMP, the output voltage $V_{out}$ of the operational amplifier AMP gradually increases until the $V_{out}$ is greater than the preset voltage threshold $V_x$ in the comparison module 13. At this time, the amount $Q_{accumulate}$ of charges received by the operational amplifier AMP reaches a critical value $Q_{max}$, where $Q_{max}=C_{ref1}*V_x$. The output of the comparison module 13 changes from 0 to 1. The charge conversion module 2 outputs negative charges $Q_4$ with a preset charge amount to the operational amplifier AMP, and the output $V_{out}$ of the operational amplifier AMP satisfies $V_{out}=(Q_{accumulate}-Q_4)/C_{ref1}$. After multiple charge transfers, the output $V_{out}$ of the operational amplifier AMP satisfies $V_{out}=Qc_x/C_{ref1}+V_{out'}$, where $V_{out'}$ represents the output of the operational amplifier AMP in the previous charge transfer.

Figure 7:
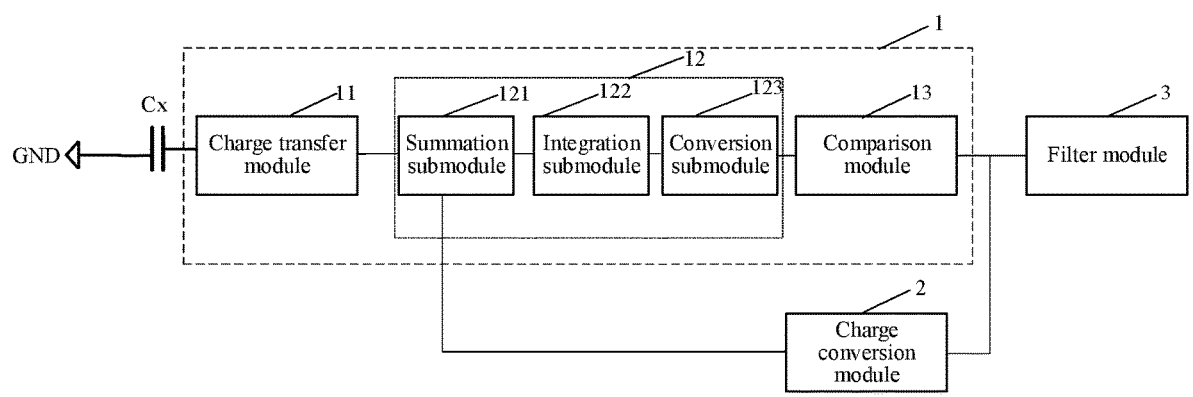
FIG. 7 is a block diagram of the voltage conversion module according to the second embodiment of the present disclosure.

It should be noted that in this embodiment, the function of the voltage conversion module 12 is realized by a circuit shown in FIG. 6, but the invention is not limited to such exemplification. Referring to FIG. 7, the voltage conversion module 12 includes a summation submodule 121, an integration submodule 122 and a conversion submodule 123 which are connected in sequence, and the summation submodule 121 is connected to the charge transfer module 11 and the charge conversion module 2 respectively. Herein, the summation submodule 121 is configured to calculate an algebraic sum of received charges, the integration submodule 122 is configured to capture and sum the charges output by the summation submodule 121, and the conversion submodule 123 is configured to convert the charges output by the integration submodule 122 into an analog voltage signal.

Figure 8:
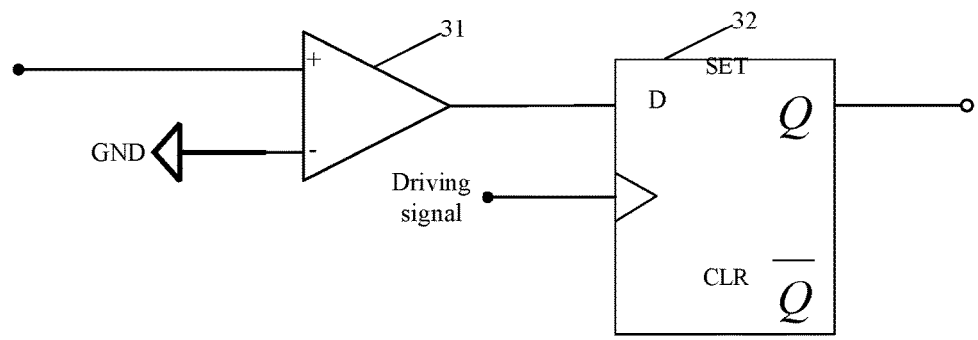
FIG. 8 is a structural diagram of a comparison module according to the second embodiment of the present disclosure.

In this embodiment, referring to FIG. 8, the comparison module 13 includes a voltage comparator 131 and a first trigger 132. The first trigger 132 may be a D trigger (which is taken as an example in the figure).

A non-inverting input of the voltage comparator 131 is connected to the voltage conversion module 12, and an inverting input of the voltage comparator 131 is grounded (GND). An output of the voltage comparator 131 is connected to a first input of the first trigger 132, a second input of the first trigger 132 is configured to receive a driving signal, and an output of the first trigger 132 is connected to the filter module 3. Herein, the driving signal may be the clock signal shown in FIG. 4.

The voltage comparator 131 is configured to output a high level in response to a voltage value of the analog voltage signal being greater than a voltage threshold, and output a low level in response to the voltage value of the analog voltage signal being less than the voltage threshold.

The first trigger 132 is configured to output a current level of the voltage comparator 131 as a level of the digital voltage signal in response to the driving signal being at a rising edge, and keep the level of the output digital voltage signal unchanged in response to the driving signal being at a falling edge. That is, the first trigger 132 takes the current level of the voltage comparator 131 as the level of the output digital voltage signal in response to the driving signal being at a high level, and the first trigger 132 keeps the level of the output digital voltage signal unchanged in response to the driving signal being at a low level.

Compared with the first embodiment, this embodiment provides specific structures of the charge transfer module, the voltage conversion module and the comparison module in the capacitance detection circuit.

A third embodiment of the present disclosure relates to a capacitance detection circuit. Compared with the second embodiment, the main difference of this embodiment is that a specific structure of a charge conversion module is provided.

Figure 9:
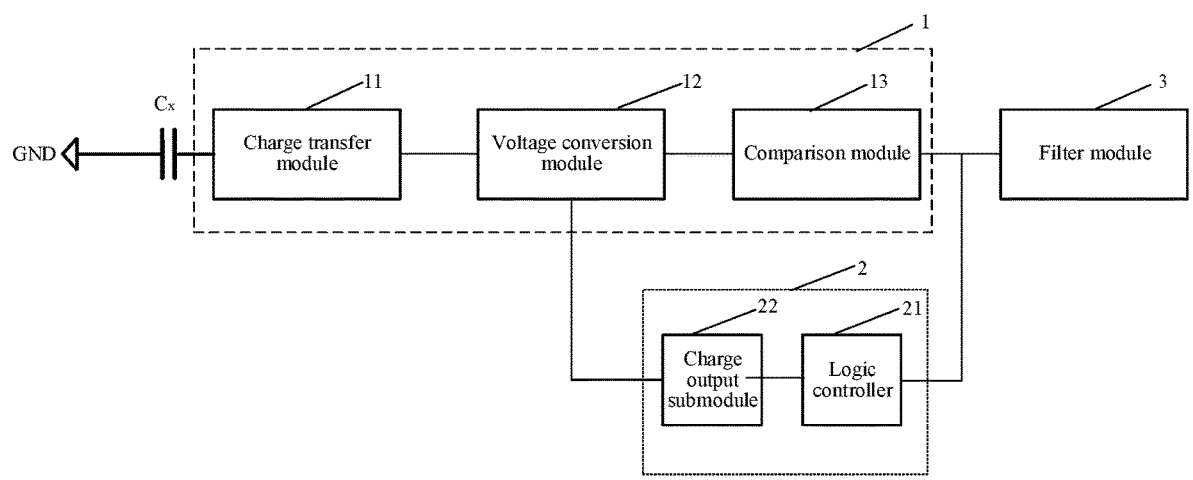
FIG. 9 is a structural diagram of a charge conversion module according to a third embodiment of the present disclosure.

In this embodiment, referring to FIG. 9, a charge conversion module 2 includes a logic controller 21 and a charge output submodule 22. A first terminal of the logic controller 21 is connected to a comparison module 13, and a second terminal of the logic controller 21 is connected to a voltage conversion module 12 through the charge output submodule 22.

In response to a digital voltage signal being at a high level, the logic controller 21 is configured to control the charge output submodule 22 to output negative charges with a preset charge amount to the voltage conversion module 12.

Figure 10:
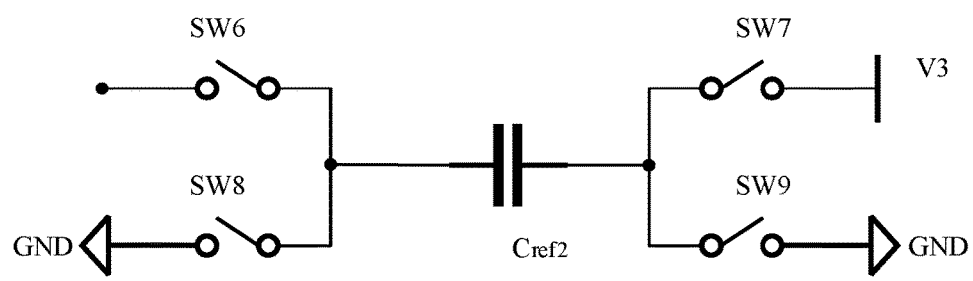
FIG. 10 is a structural diagram of a charge output sub-module according to the third embodiment of the present disclosure.

In an example, referring to FIG. 10, the charge output submodule 22 includes a sixth switch SW6, a seventh switch SW7, an eighth switch SW8, a ninth switch SW9, a third power supply V3 and a second reference capacitor $C_{ref2}$.

A first terminal of the sixth switch SW6 is connected to the voltage conversion module 12, a second terminal of the sixth switch SW6 is connected to a first terminal of the eighth switch SW8, a second terminal of the eighth switch SW8 is grounded, a connection between the sixth switch SW6 and the eighth switch SW8 is connected to a first terminal of the second reference capacitor $C_{ref2}$. A first terminal of the seventh switch SW7 is connected to the third power supply V3, a second terminal of the seventh switch SW7 is connected to a first terminal of the ninth switch SW9, a second terminal of the ninth switch SW9 is grounded, and a connection between the seventh switch SW7 and the ninth switch SW9 is connected to a second terminal of the second reference capacitor $C_{ref2}$. And a control terminal of the sixth switch SW6, a control terminal of the seventh switch SW7, a control terminal of the eighth switch SW8 and a control terminal of the ninth switch SW9 are respectively connected to the logic controller 21.

In response to the digital voltage signal being at a high level, the logic controller 21 is configured to control the sixth switch SW6 and the ninth switch SW9 to be opened and control the seventh switch SW7 and the eighth switch SW8 to be closed. At this time, the second reference capacitor $C_{ref2}$ is connected to the third power supply V3 and is charged to a reference voltage $V_{ref2}$. The amount $Q_{ref2}$ of charges stored in the second reference capacitor $C_{ref2}$ satisfies $Q_{ref2}=-V_{ref2}*C_{ref2}$, which is referred as a preset charge amount, and the charges stored in the second reference capacitor $C_{ref2}$ is released to the voltage conversion module 12.

In response to the digital voltage signal being at a low level, the logic controller 21 is configured to control the sixth switch SW6 and the ninth switch SW9 to be closed and control the seventh switch SW7 and the eighth switch SW8 to be opened. The second reference capacitor $C_{ref2}$ is grounded (GND), and all the charges stored in the second reference capacitor $C_{ref2}$ are released to the ground.

Compared with the first embodiment, this embodiment provides a specific structure of the charge conversion module.

Figure 11:
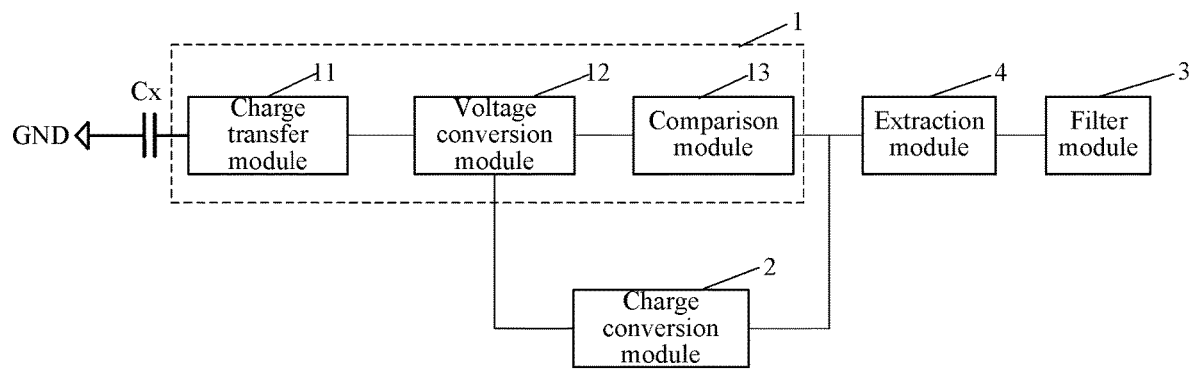
FIG. 11 is a schematic diagram of a capacitance detection circuit according to a fourth embodiment of the present disclosure.

A fourth embodiment of the present disclosure relates to a capacitance detection circuit. Compared with the first embodiment, the main difference of this embodiment is that, referring to FIG. 11, the capacitance detection circuit further includes an extraction module 4. A comparison module 13 is connected to a filter module 3 through the extraction module 4.

The extraction module 4 is configured to output a digital voltage signal within a preset time period to the filter module 3.

In an example, the extraction module 4 is an AND circuit. A first input of the AND circuit is connected to the comparison module 13, and an output of the AND circuit is connected to the filter module 3. A second input of the AND circuit is configured to receive an output control signal, and a duration of the output control signal at a high level in one cycle is designated as the preset time period. That is, referring to FIG. 12, the output control signal is a periodic signal, which is at a high level within a preset time period T in one cycle of the output control signal, so that the digital voltage signal in the preset time period T may be extracted and input into the filter module 3. The filter module 3 may obtain a value representing a capacitance of a capacitor to be detected in this cycle according to the digital voltage signal in the preset time period T. Thus, the value of the capacitance of the capacitor $C_x$ to be detected may be obtained periodically.

Figure 13:
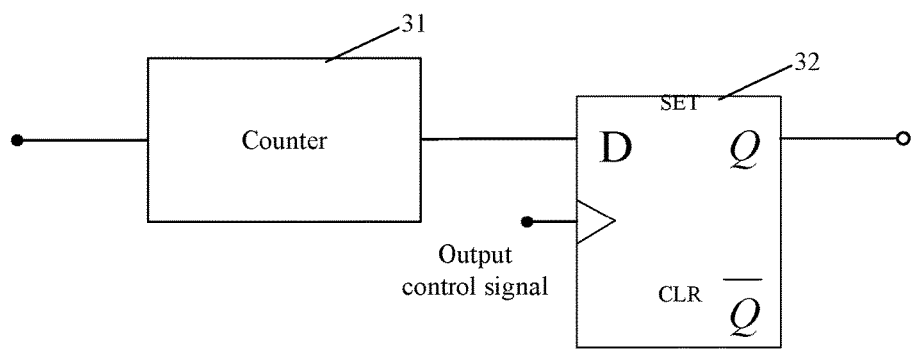
FIG. 13 is a structural diagram of a filter module according to the fourth embodiment of the present disclosure.

In an example, referring to FIG. 13, the filter module 3 includes a counter 31 and a second trigger 32. The second trigger 32 may be a D trigger.

Figure 12:
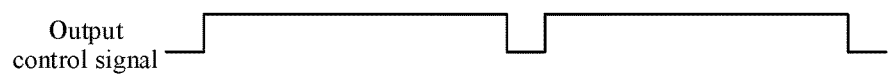
FIG. 12 is a timing diagram of an output control signal according to the fourth embodiment of the present disclosure.

The comparison module 13 is connected to an input of the counter 31, an output of the counter 31 is connected to a first input of the second trigger 32, and a second input of the second trigger 32 is configured to receive an output control signal (as shown in FIG. 12).

A driving terminal of the counter 31 is configured to receive a driving signal (as shown in FIG. 4). In response to that the driving signal is at a rising edge and the digital voltage signal is at a high level, the counter 31 is configured to add 1 to a current count value.

In response to the output control signal being at the rising edge, the second trigger 32 is configured to output the count value of the counter 31 as the value representing the capacitance of the capacitor $C_x$ to be detected.

In this embodiment, the counter 31 counts in response to the driving signal being at the high level, adds 1 to the count value in response to the digital voltage signal being at the high level, and keeps the count value unchanged in response to the digital voltage signal being at a low level. In response to the output control signal being at the rising edge, the second trigger 32 outputs the count value accumulated by the counter 31 as the value representing the capacitance of the capacitor $C_x$ to be detected, and clears the count value of the counter 31.

Compared with the first embodiment, the extraction module is added into the capacitance detection circuit in this embodiment, so that the capacitor to be detected may be periodically detected, thereby reducing the power consumption.

A fifth embodiment of the present disclosure relates to a sensor. The sensor may be a capacitance sensor, and the sensor may be applied in an electronic device. The sensor includes the capacitance detection circuit provided in any one of the first to fourth embodiments.

A sixth embodiment of the present disclosure relates to a chip. The chip may be a capacitance detection chip, and the chip may be applied in an electronic device. The chip includes the capacitance detection circuit provided in any one of the first to fourth embodiments.

A seventh embodiment of the present disclosure relates to an electronic device including the capacitance detection circuit provided in any one of the first to fourth embodiments. The electronic device may be, for example, a mobile phone, a tablet PC, and the like.

In an example, the electronic device further includes a processor, which is configured to obtain a capacitance of a capacitor to be detected according to a value representing the capacitance of the capacitor to be detected which is output by the capacitance detection circuit. Specifically, the capacitance of the capacitor $C_x$ to be detected is obtained according to a preset measurement range of the capacitance detection circuit. For example, the measurement range of the capacitance detection circuit is 0 to 10 pF, and the charge and discharge times of the capacitor $C_x$ to be detected are 1000 times. If the number of values 1 in the digital voltage signal corresponding to 1000 charge and discharge times is 500, the capacitance value of the capacitor $C_x$ to be detected is 500÷1000×10 pF=5 pF.

Those skilled in the art should appreciate that the embodiments described above are specific embodiments for implementing the present disclosure. In practice, however, various changes may be made in the forms and details of the specific embodiments without departing from the spirit and scope of the present disclosure.

What is claimed is:

1. A capacitance detection circuit, comprising: a capacitance control module, a charge conversion module and a filter module, which are connected with each other;
   wherein the capacitance control module is configured to control a capacitor to be detected to be charged and discharged for multiple times, and generate a digital voltage signal according to an amount of received charges; wherein the capacitor to be detected releases all stored charges after being charged to a preset voltage during each charge and discharge;
   in response to the digital voltage signal being at a high level, the charge conversion module is configured to output negative charges with a preset charge amount to the capacitance control module, wherein the preset charge amount is greater than or equal to an amount of the stored charges when the capacitor to be detected is charged to the preset voltage; and
   the filter module is configured to obtain a value representing a capacitance of the capacitor to be detected according to the digital voltage signal generated after the capacitor to be detected is charged and discharged for the multiple times;
      wherein the filter module includes a counter and a first trigger; the capacitance control module is connected to an input of the counter, an output of the counter is connected to a first input of the first trigger, and a second input of the first trigger is configured to receive an output control signal; wherein the counter has a driving terminal configured to receive a driving signal, and in response to the driving signal being at a rising edge and the digital voltage signal being at a high level, the counter is configured to add 1 to a current count value; and
      in response to the output control signal being at the rising edge, the first trigger is configured to output a count value of the counter as the value representing the capacitance of the capacitor to be detected.

2. The capacitance detection circuit according to claim 1, wherein the capacitance control module comprises a charge transfer module, a voltage conversion module and a comparison module which are connected in sequence; wherein the comparison module is connected to the filter module, and the charge conversion module is connected to the voltage conversion module;
   wherein the charge transfer module is configured to control the capacitor to be detected to be charged and discharged for the multiple times, wherein the capacitor to be detected releases all the stored charges to the voltage conversion module after being charged to the preset voltage during each charge and discharge;
   the voltage conversion module is configured to convert all the stored charges that are received into an analog voltage signal;
   the comparison module is configured to output the digital voltage signal according to a preset voltage threshold and the analog voltage signal; and
   in response to the digital voltage signal being at the high level, the charge conversion module is configured to output the negative charges with the preset charge amount to the voltage conversion module.

3. The capacitance detection circuit according to claim 2, wherein the charge transfer module comprises a first switch, a second switch and a first power supply;
   wherein the first power supply is connected to a first terminal of the first switch, a second terminal of the first switch is connected to a first terminal of the second switch, a second terminal of the second switch is grounded, a connection between the first switch and the second switch is connected to a first terminal of the capacitor to be detected, a second terminal of the capacitor to be detected is connected to the voltage conversion module, and a control terminal of the first switch and a control terminal of the second switch are respectively configured to receive a driving signal;
   in response to the driving signal, the first switch is configured to be closed when the capacitor to be detected is charged and be opened when the capacitor to be detected is discharged; and
   in response to the driving signal, the second switch is configured to be opened when the capacitor to be detected is charged and be closed when the capacitor to be detected is discharged.

4. The capacitance detection circuit according to claim 2, wherein the charge transfer module comprises a third switch, a fourth switch and a second power supply;
   wherein the second power supply is connected to a first terminal of the third switch, a second terminal of the third switch is connected to a first terminal of the fourth switch, a second terminal of the fourth switch is connected to the voltage conversion module, a connection between the third switch and the fourth switch is connected to a first terminal of the capacitor to be detected, a second terminal of the capacitor to be detected is grounded, and a control terminal of the third switch and a control terminal of the fourth switch are respectively configured to receive a driving signal;
   in response to the driving signal, the third switch is configured to be opened when the capacitor to be detected is discharged and be closed when the capacitor to be detected is charged; and
   in response to the driving signal, the fourth switch is configured to be closed when the capacitor to be detected is discharged and be opened when the capacitor to be detected is charged.

5. The capacitance detection circuit according to claim 2, wherein the voltage conversion module comprises an operational amplifier, a first reference capacitor and a fifth switch;
   wherein the charge transfer module and the charge conversion module are respectively connected to an inverting input of the operational amplifier, a non-inverting input of the operational amplifier is grounded, two terminals of the first reference capacitor are respectively connected to the inverting input of the operational amplifier and an output of the operational amplifier, two terminals of the fifth switch are respectively connected to the two terminals of the first reference capacitor, and a control terminal of the fifth switch is configured to receive a reset signal; and
   in response to the reset signal, the fifth switch is configured to keep closed within a preset duration before the charge transfer module controls the capacitor to be detected to be charged and discharged for the multiple times.

6. The capacitance detection circuit according to claim 2, wherein the comparison module comprises a voltage comparator and a second trigger;
   wherein a non-inverting input of the voltage comparator is connected to the voltage conversion module, an inverting input of the voltage comparator is grounded, an output of the voltage comparator is connected to a first input of the second trigger, a second input of the second trigger is configured to receive an output control signal, a third input of the second trigger is configured to receive a driving signal, and an output of the second trigger is connected to the filter module;

in response to a voltage value of the analog voltage signal being larger than the voltage threshold, the voltage comparator is configured to output a high level, and in response to the voltage value of the analog voltage signal being smaller than the voltage threshold, the voltage comparator is configured to output a low level; and in response to the driving signal being at a rising edge, the second trigger is configured to output a current level of the voltage comparator as a level of the digital voltage signal, and in response to the driving signal being at a falling edge, the second trigger is configured to keep the level of the digital voltage signal unchanged.

7. The capacitance detection circuit according to claim 2, wherein the charge conversion module comprises a logic controller and a charge output submodule, a first terminal of the logic controller is connected to the comparison module, and a second terminal of the logic controller is connected to the voltage conversion module through the charge output submodule;

wherein in response to the digital voltage signal being at the high level, the logic controller is configured to control the charge output submodule to output the negative charges with the preset charge amount to the voltage conversion module.

8. The capacitance detection circuit according to claim 7, wherein the charge output submodule comprises a sixth switch, a seventh switch, an eighth switch, a ninth switch, a third power supply and a second reference capacitor;

wherein a first terminal of the sixth switch is connected to the voltage conversion module, a second terminal of the sixth switch is connected to a first terminal of the eighth switch, a second terminal of the eighth switch is grounded, a connection between the sixth switch and the eighth switch is connected to a first terminal of the second reference capacitor, a first terminal of the seventh switch is connected to the third power supply, a second terminal of the seventh switch is connected to a first terminal of the ninth switch, a second terminal of the ninth switch is grounded, and a connection between the seventh switch and the ninth switch is connected to a second terminal of the second reference capacitor;

a control terminal of the sixth switch, a control terminal of the seventh switch, a control terminal of the eighth switch and a control terminal of the ninth switch are respectively connected to the logic controller;

in response to the digital voltage signal being at a low level, the logic controller is configured to control the sixth switch and the ninth switch to be closed and control the seventh switch and the eighth switch to be opened; and in response to the digital voltage signal being at the high level, the logic controller is configured to control the sixth switch and the ninth switch to be opened and control the seventh switch and the eighth switch to be closed.

9. The capacitance detection circuit according to claim 1, wherein the capacitance detection circuit further comprises an extraction module; the capacitance control module is connected to the filter module through the extraction module;

wherein the extraction module is configured to output the digital voltage signal within a preset time period to the filter module.

10. The capacitance detection circuit according to claim 9, wherein the extraction module is an AND circuit; a first input of the AND circuit is connected to the capacitance control module, and an output of the AND circuit is connected to the filter module;

wherein a second input terminal of the AND circuit is configured to receive an output control signal, and the preset time period is a duration of the output control signal at a high level in one cycle.

11. A sensor, comprising the capacitance detection circuit according to claim 1.

12. A chip, comprising a capacitance detection circuit, wherein the capacitance detection circuit comprises:

a capacitance control module, a charge conversion module and a filter module which are connected with each other;

wherein the capacitance control module is configured to control a capacitor to be detected to be charged and discharged for multiple times, and generate a digital voltage signal according to an amount of received charges; wherein the capacitor to be detected releases all stored charges after being charged to a preset voltage during each charge and discharge;

in response to the digital voltage signal being at a high level, the charge conversion module is configured to output negative charges with a preset charge amount to the capacitance control module, wherein the preset charge amount is greater than or equal to an amount of the stored charges when the capacitor to be detected is charged to the preset voltage; and the filter module is configured to obtain a value representing a capacitance of the capacitor to be detected according to the digital voltage signal generated after the capacitor to be detected is charged and discharged for the multiple times;

wherein the filter module includes a counter and a first trigger; the capacitance control module is connected to an input of the counter, an output of the counter is connected to a first input of the first trigger, and a second input of the first trigger is configured to receive an output control signal; wherein the counter has a driving terminal configured to receive a driving signal, and in response to the driving signal being at a rising edge and the digital voltage signal being at a high level, the counter is configured to add 1 to a current count value; and in response to the output control signal being at the rising edge, the first trigger is configured to output a count value of the counter as the value representing the capacitance of the capacitor to be detected.

13. The chip according to claim 12, wherein the capacitance control module comprises a charge transfer module, a voltage conversion module and a comparison module which are connected in sequence; wherein the comparison module is connected to the filter module, and the charge conversion module is connected to the voltage conversion module;

wherein the charge transfer module is configured to control the capacitor to be detected to be charged and discharged for the multiple times, wherein the capacitor to be detected releases all the stored charges to the voltage conversion module after being charged to the preset voltage during each charge and discharge;

the voltage conversion module is configured to convert all the stored charges that are received into an analog voltage signal;

the comparison module is configured to output the digital voltage signal according to a preset voltage threshold and the analog voltage signal; and in response to the digital voltage signal being at the high level, the charge conversion module is configured to output the negative charges with the preset charge amount to the voltage conversion module.

14. The chip according to claim 13, wherein the charge transfer module comprises a first switch, a second switch and a first power supply;

wherein the first power supply is connected to a first terminal of the first switch, a second terminal of the first switch is connected to a first terminal of the second switch, a second terminal of the second switch is grounded, a connection between the first switch and the second switch is connected to a first terminal of the capacitor to be detected, a second terminal of the capacitor to be detected is connected to the voltage conversion module, and a control terminal of the first switch and a control terminal of the second switch are respectively configured to receive a driving signal;

in response to the driving signal, the first switch is configured to be closed when the capacitor to be detected is charged and be opened when the capacitor to be detected is discharged; and in response to the driving signal, the second switch is configured to be opened when the capacitor to be detected is charged and be closed when the capacitor to be detected is discharged.

15. The chip according to claim 13, wherein the charge transfer module comprises a third switch, a fourth switch and a second power supply;

wherein the second power supply is connected to a first terminal of the third switch, a second terminal of the third switch is connected to a first terminal of the fourth switch, a second terminal of the fourth switch is connected to the voltage conversion module, a connection between the third switch and the fourth switch is connected to a first terminal of the capacitor to be detected, a second terminal of the capacitor to be detected is grounded, and a control terminal of the third switch and a control terminal of the fourth switch are respectively configured to receive a driving signal;

in response to the driving signal, the third switch is configured to be opened when the capacitor to be detected is discharged and be closed when the capacitor to be detected is charged; and in response to the driving signal, the fourth switch is configured to be closed when the capacitor to be detected is discharged and be opened when the capacitor to be detected is charged.

16. The chip according to claim 13, wherein the voltage conversion module comprises an operational amplifier, a first reference capacitor and a fifth switch;

wherein the charge transfer module and the charge conversion module are respectively connected to an inverting input of the operational amplifier, a non-inverting input of the operational amplifier is grounded, two terminals of the first reference capacitor are respectively connected to the inverting input of the operational amplifier and an output of the operational amplifier, two terminals of the fifth switch are respectively connected to the two terminals of the first reference capacitor, and a control terminal of the fifth switch is configured to receive a reset signal; and in response to the reset signal, the fifth switch is configured to keep closed within a preset duration before the charge transfer module controls the capacitor to be detected to be charged and discharged for the multiple times.

17. The chip according to claim 13, wherein the comparison module comprises a voltage comparator and a second trigger;

wherein a non-inverting input of the voltage comparator is connected to the voltage conversion module, an inverting input of the voltage comparator is grounded, an output of the voltage comparator is connected to a first input of the second trigger, a second input of the second trigger is configured to receive an output control signal, a third input of the second trigger is configured to receive a driving signal, and an output of the second trigger is connected to the filter module;

in response to a voltage value of the analog voltage signal being larger than the voltage threshold, the voltage comparator is configured to output a high level, and in response to the voltage value of the analog voltage signal being smaller than the voltage threshold, the voltage comparator is configured to output a low level; and in response to the driving signal being at a rising edge, the second trigger is configured to output a current level of the voltage comparator as a level of the digital voltage signal, and in response to the driving signal being at a falling edge, the second trigger is configured to keep the level of the digital voltage signal unchanged.

18. An electronic device, comprising a capacitance detection circuit, wherein the capacitance detection circuit comprises:

a capacitance control module, a charge conversion module and a filter module which are connected with each other;

wherein the capacitance control module is configured to control a capacitor to be detected to be charged and discharged for multiple times, and generate a digital voltage signal according to an amount of received charges; wherein the capacitor to be detected releases all stored charges after being charged to a preset voltage during each charge and discharge;

in response to the digital voltage signal being at a high level, the charge conversion module is configured to output negative charges with a preset charge amount to the capacitance control module, wherein the preset charge amount is greater than or equal to an amount of the stored charges when the capacitor to be detected is charged to the preset voltage; and the filter module is configured to obtain a value representing a capacitance of the capacitor to be detected according to the digital voltage signal generated after the capacitor to be detected is charged and discharged for the multiple times;

wherein the filter module includes a counter and a first trigger; the capacitance control module is connected to an input of the counter, an output of the counter is connected to a first input of the first trigger, and a second input of the first trigger is configured to receive an output control signal; wherein the counter has a driving terminal configured to receive a driving signal, and in response to the driving signal being at a rising edge and the digital voltage signal being at a high level, the counter is configured to add 1 to a current count value; and in response to the output control signal being at the rising edge, the first trigger is configured to output a count value of the counter as the value representing the capacitance of the capacitor to be detected.

19. The electronic device according to claim 18, wherein the electronic device further comprises a processor;
wherein the processor is configured to obtain the capacitance of the capacitor to be detected according to the value representing the capacitance of the capacitor to be detected output by the capacitance detection circuit.

* * * * *